United States Patent [19]
Eastty et al.

[11] Patent Number: 6,002,353
[45] Date of Patent: Dec. 14, 1999

[54] ONE-BIT DIGITAL SIGNAL PROCESSING

[75] Inventors: Peter Charles Eastty, Oxford; Christopher Sleight; Peter Damien Thorpe, both of Oxon, all of United Kingdom

[73] Assignees: Sony Corporation, Tokyo, Japan; Sony United Kingdom Limited, Weybridge, United Kingdom

[21] Appl. No.: 08/978,724

[22] Filed: Nov. 26, 1997

[30] Foreign Application Priority Data

Nov. 27, 1996 [GB] United Kingdom ............ 9624667

[51] Int. Cl.$^6$ ..................................... H03M 3/02
[52] U.S. Cl. ............................................. 341/143
[58] Field of Search .................... 341/143, 144, 341/155, 63; 375/200

[56] References Cited

U.S. PATENT DOCUMENTS 4,995,053  2/1991  Simpson et al. ..................... 375/1

FOREIGN PATENT DOCUMENTS

| 02007720 | 1/1990 | Japan . |
| 1077878 | 8/1967 | United Kingdom . |
| 2025176 | 1/1980 | United Kingdom . |

*Primary Examiner*—Brian Young
*Attorney, Agent, or Firm*—Frommer Lawrence & Haug, LLP; William S. Frommer

[57] ABSTRACT

An input stage for receiving an input signal having a signal level varying to represent successive states of a one-bit digital signal, comprises: a thresholder for detecting whether the input signal level is above or below a threshold signal level; in which: the input of the thresholder is biased with a bias signal varying between a signal level above the threshold signal level and a signal level below the threshold signal level; and the amplitude of the alternating component of the bias signal is lower than the amplitude of the alternating component of the input signal.

9 Claims, 1 Drawing Sheet

ONE-BIT DIGITAL SIGNAL PROCESSING

BACKGROUND OF THE INVENTION

1. Field of the Invention

This invention relates to processing one-bit digital signals (e.g. one-bit digital audio signals), and to input stages for receiving such signals.

2. Description of the Prior Art

When a one-bit signal is received by digital signal processing apparatus (e.g. from a transmission line such as a coaxial cable) it is common to use a thresholder or slicer to "clean up" the received signal. This is done by the thresholder generating an output at one of two signal levels (to represent the two possible states of the one-bit signal) dependent upon whether the received signal is above or below a threshold level.

However, if the signal on the cable is removed (for example, because the source of the signal is unplugged or powered down), then the thresholder would output a consecutive string of the same value, which in one-bit digital systems represents a very large output signal indeed. In a one-bit digital audio system this could lead to overload of subsequent processing devices.

SUMMARY OF THE INVENTION

This invention provides an input stage for receiving an input signal having a signal level varying to represent successive states of a one-bit digital signal, the input stage comprising:

a thresholder for detecting whether the input signal level is above or below a threshold signal level;

in which:

the input of the thresholder is biased with a bias signal varying between a signal level above the threshold signal level and a signal level below the threshold signal level; and the amplitude of the alternating component of the bias signal is lower than the amplitude of the alternating component of the input signal.

The invention addresses the above problems by providing a bias signal which may represent, for example, one-bit "digital silence" (e.g. alternate ones and zeroes or a repeating pattern of substantially equal numbers of ones and zeroes such as 01101001) at the input of the thresholder. The alternating component of the bias signal is smaller than the alternating component of the received digital signal, so it makes a trivial contribution to the received signal when that signal is present and so makes substantially no difference to the data normally detected from the received signal. However, if the received signal is removed, then the thresholder will operate on the bias signal and will output a "digital silence" signal (a sequence of ones and zeroes) rather than successive bits of the same value.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
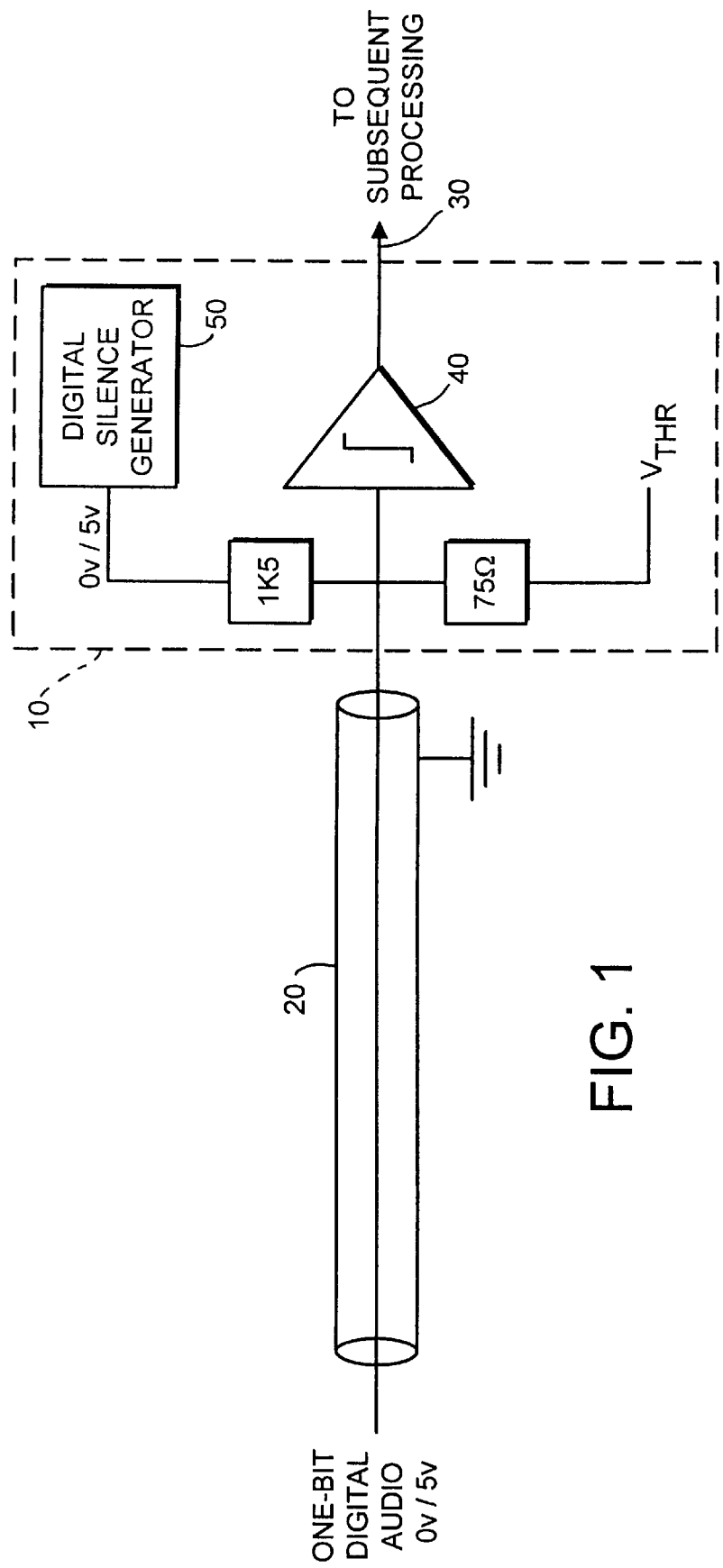
FIG. 1 schematically illustrates an input stage for a one-bit digital signal processing apparatus.

Referring to FIG. 1, an input stage 10 is arranged to receive a one-bit digital audio signal from a coaxial cable transmission line 20, and to supply an output one-bit digital audio signal 30 to subsequent processing devices within a digital signal processing apparatus such as an audio mixing console. 2 In this example, the signal supplied on the coaxial cable has a nominal voltage of 0 volts for a digital 0 and 5 volts for a digital 1.

In the input stage 10, a thresholder (e.g. a Schmidt trigger) 40 is used to "clean up" the signal received from the coaxial cable 20, by generating one of two output signals (e.g. 0 volts and 5 volts for digital 0 and 1 respectively) dependent on whether the received input signal from the coaxial cable 20 is above or below a threshold voltage (e.g. 2.5 volts). Thus, even if noise is induced or the signal level falls as the input signal is transmitted along the coaxial cable 20, the thresholder can reconstruct a version of the one-bit digital audio signal having clearly defined voltages representing digital 1 and 0.

The coaxial cable is terminated by a resistance equal to the characteristic impedance of the coaxial cable (in this case 75 ohms), connected between the input of the thresholder 40 and a voltage rail equal to the threshold voltage (in this case, 2.5 volts). Similarly, the output of a digital silence generator (e.g. a square wave generator) 50 (ranging between 0 volts and 5 volts) is connected via a much larger resistor (in this example, 1500 ohms) to the input of the thresholder 40.

Because the 1500 ohms resistor is much larger than the 75 ohms resistor, the input one-bit digital audio signal on the coaxial cable 20 is received by the thresholder 40 almost as if the coaxial cable was simply correctly terminated with a 75 ohms resistor. Thus, when the one-bit digital audio signal is present on the coaxial cable 20, the thresholder 40 receives a signal varying between about 0 volts and about 5 volts and so operates correctly to derive the output signal 30 for subsequent processing.

The digital silence generator itself generates an output signal varying between 0 volts and 5 volts, but the two resistors (1500 ohms and 75 ohms) act as a potential divider, so that there is effectively a square wave having a peaked peak amplitude of about one-quarter of a volt present at the input of the thresholder 40. Because of the termination to the threshold voltage $V_{THR}$, the combined effect of the termination and the square wave provide a one-quarter volt peak-to-peak square wave substantially centred around the threshold voltage being put to the thresholder 40.

So, when the one-bit digital audio signal is present on the coaxial cable 20, this alternating bias voltage is negligible.

However, if the one-bit digital audio signal is absent, for example because the connecting cable is unplugged from the input stage 10 or because the unit generating the audio signal for transmission along the coaxial cable 20 is powered down, then the thresholder 40 still receives the alternating bias signal either the side of the threshold voltage, and so the thresholder 40 will generate the output signal 30 comprising alternate ones and zeroes (a representation of silence in a one-bit digital audio system).

The two resistors used for termination and bias of the thresholder 40 are selected so that the resulting alternating biasing component (in this example, one-quarter of a volt peak-to-peak) has a greater amplitude than the hysteresis of the thresholder 40.

In a further preferred embodiment the input signal is ac-coupled to the thresholder 40, e.g. via a capacitor (not shown), so that if the input signal becomes all ones or all zeroes it does not pull the thresholder input to a level such that the relatively small bias signal no longer influences the thresholder.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An input stage for receiving an input signal having an alternating component whose amplitude varies to represent successive states of a one-bit digital signal, said input stage comprising:

a thresholder for detecting whether said input signal level is above or below a threshold signal level;

in which:

the input of said thresholder is biased with a bias signal having an alternating component whose amplitude varies between a signal level above said threshold signal level and a signal level below said threshold signal level; and the amplitude of the alternating component of said bias signal is lower than the amplitude of the alternating component of said input signal.

2. An input stage according to claim 1, in which said input signal is supplied to said input stage by a transmission line; and said input stage comprises a termination impedance for terminating said transmission line; said termination impedance being connected between said transmission line and a termination signal level substantially equal to said threshold signal level.

3. An input stage according to claim 2, in which said bias signal is coupled to said input of said thresholder via a coupling impedance greater than said termination impedance.

4. An input stage according to of claim 1, in which said bias signal varies between said signal level above the threshold signal level and said signal level below said threshold signal level according to a pattern of variation such that said bias signal is above said threshold level and below said threshold level for substantially equal proportions of time.

5. An input stage according to claim 4, in which said bias signal cyclically varies between said signal level above said threshold signal level and said signal level below said threshold signal level at a frequency substantially equal to the bit rate of the one-bit digital signal.

6. An input stage according to claim 1, in which said amplitude of said alternating component of said bias signal is greater than the hysteresis of said thresholder.

7. An input stage according to claim 1, in which said input signal is ac-coupled to said thresholder.

8. An input stage for receiving an input signal having a signal level varying to represent successive states of a one-bit digital signal by detecting whether said input signal level is above or below a threshold signal level, said input stage being operable to generate an output one-bit signal admitting of first or second digital output values, and wherein said output one-bit signal is comprised of substantially equal proportions of both digital output values in response to an input signal continuously above or continuously below said threshold signal level.

9. Digital signal processing apparatus comprising an input stage according to claim 1.

* * * * *